United States Patent
Kowarz et al.

(10) Patent No.: US 9,195,048 B1
(45) Date of Patent: Nov. 24, 2015

(54) TERAHERTZ TUNABLE FILTER WITH MICROFABRICATED MIRRORS

(71) Applicant: EXELIS, INC., McLean, VA (US)

(72) Inventors: Marek W. Kowarz, Henrietta, NY (US); Jeffrey Daniel Newman, Pittsford, NY (US)

(73) Assignee: Exelis, Inc., Herndon, VA (US)

( * ) Notice: Subject to any disclaimer, the term of this patent is extended or adjusted under 35 U.S.C. 154(b) by 48 days.

(21) Appl. No.: 14/223,454

(22) Filed: Mar. 24, 2014

Related U.S. Application Data (63) Continuation-in-part of application No. 13/785,435, filed on Mar. 5, 2013.

(51) Int. Cl.
| | |
|---|---|
| H01Q 15/14 | (2006.01) |
| G02B 26/00 | (2006.01) |
| H01L 27/146 | (2006.01) |
| H01L 31/0232 | (2014.01) |

(52) U.S. Cl.
CPC ........ *G02B 26/001* (2013.01); *H01L 27/14629* (2013.01); *H01L 31/02327* (2013.01); *H01Q 15/144* (2013.01)

(58) Field of Classification Search
CPC ............. H01Q 15/144; B32B 2551/08; B32B 2307/416
See application file for complete search history.

(56) References Cited

U.S. PATENT DOCUMENTS

| | | | |
|---|---|---|---|
| 5,550,373 A | 8/1996 | Cole et al. | |
| 5,561,523 A | 10/1996 | Blomberg et al. | |
| 6,608,711 B2 * | 8/2003 | Flanders et al. | ........... 359/224.1 |
| 6,621,083 B2 | 9/2003 | Cole | |
| 7,372,115 B2 * | 5/2008 | Baney | ............ 257/419 |
| 7,489,024 B2 | 2/2009 | Socher et al. | |
| 7,864,326 B2 | 1/2011 | Cox et al. | |
| 8,198,590 B2 | 6/2012 | Cox et al. | |
| 2005/0179606 A1 | 8/2005 | Holly | |
| 2006/0152412 A1 | 7/2006 | Evans et al. | |
| 2011/0163932 A1 | 7/2011 | Mosbacker | |
| 2011/0254959 A1 | 10/2011 | Seppa et al. | |
| 2011/0315880 A1 | 12/2011 | Nemirovsky | |
| 2012/0032082 A1 | 2/2012 | Pradere et al. | |

(Continued)

FOREIGN PATENT DOCUMENTS

| | | |
|---|---|---|
| DE | 10 2008 031 751 | 8/2009 |
| WO | WO 92/04653 | 3/1992 |

OTHER PUBLICATIONS

Machine Translation of DE 10 2008 031 751 (Hohmuth et al.).

(Continued)

*Primary Examiner* — Constanmtine Hannaher
(74) *Attorney, Agent, or Firm* — RatnerPrestia (57) ABSTRACT

A terahertz (THz) imaging device includes a tunable filter and a focal plane array (FPA) for receiving selected optical wavelengths of light. The tunable filter includes: (a) a first mirror comprised of a thick silicon substrate and a thin silicon membrane, in which the thin silicon membrane is separated from the thick silicon substrate by a gridded cell structure, (b) a second mirror comprised of a thick silicon substrate and a thin silicon membrane, in which the thin silicon membrane is separated from the thick silicon substrate by another gridded cell structure, and (c) a variable gap disposed between the first and second mirrors. The gridded cell structure may have a hexagonal shape, a square shape, a rectangular shape, a triangular shape or a rhombus-like shape.

27 Claims, 9 Drawing Sheets

(56) References Cited

U.S. PATENT DOCUMENTS

2012/0091342 A1    4/2012    Berger et al.
2012/0261575 A1   10/2012    Averitt et al.
2012/0261579 A1   10/2012    Ramaswamy et al.
2013/0082181 A1    4/2013    Corcos et al.
2013/0099118 A1    4/2013    Tomioka
2013/0256535 A1   10/2013    Meijer et al.

OTHER PUBLICATIONS

Office Action for U.S. Appl. No. 13/785,435, Issued Sep. 4, 2014.

Antoszewski, Jaroslaw; Keating, Adrian; Winchester, Kevin; Nguyen, Thuyen; Silva, Dilusha; Musca, Charles; Dell, John; Samardzic, Olivia; and Faraone, Lorenzo. Tunable Fabry-Perot Filters Operating in the 3 to 5 UM Range for Infrared Micro-Spectrometer Applications, Proc. SPIE—vol. 6186, MEMS, MOEMS, and Micromaching II, 2006, 618608.

Keating, A.J.; Silva, K.K.M.B.D.; Dell, John; Musca, C.A.; and Faraone, L. "Optical Characterization of Fabry-Perot MEMS Filters Integrated on Tunable Short-Wave IR Detectors." IEEE Photonics Technology Letters, vol. 18, Issue 9, May 1, 2006, pp. 1079-1-81.

Rivas, Anette; Kerekes, John; and Raisanen, Alan. "Tunable Singel Pixel MEMS Fabry-Perot Interferometer." Adaptive Optics: Methods, Analysis and Applications Toronto, Canada, Jul. 10, 2011, Joint FTS/HISE/AO/COSI Poster Session (JWA), JWA15.PDF.

Cleary, Justin W.; Fredricksen, Chris J.; Muravjov, Andrei V.; Enz, Jasen; Dolguikh, Maxim V.; Du Bosq, Todd W.; Peale, Robert E.; Folks, William R.; Pandey, Sidhartha; Boreman, Glenn; and Edwards, Oliver; Scanning Fabry-Perot Filter for Terahertz Spectroscopy Based on Silicon Dielectric Mirrors, SPIE vol. 6472, 2007.

Cleary, Justin W.; Peale, Robert E.; Todi, Ravi; Sundaram, Kalpathy; and Edwards, Oliver; Finesse of Silicon-Based Therahertz Fabry-Perot Spectrometer, SPIE, 6549-26, vol. 5, Mar. 11, 2007.

Du Bosq, Todd W.; Muravjos, Andrey V.; Peale, Robert E.; and Fredericksen, Christopher J.; "Multilayer Silicon Cavity Mirrors for the Far-Infrared p-Ge Laser"; Applied Optics, vol. 44. No. 33, Nov. 20, 2005.

P. Krippner, Y. Kühner, J. Mohr, and V. Saile, "Microspectrometer System for the Near Infrared Wavelength Range Based on the LIGA Technology", Proceedings of SPIE vol. 3912, 2000, pp. 3912-3918.

J.N. McMullin, X. Chen, "Integrated Diffraction Grating for Lab-On-A-Chip Microspectrometer", Photonics West 2005, San Jose Convention Center, Jan. 22-27, 2005, p. 5699-5676.

G. Chen, Z. Wen, Y. Xu, Z. Jiang, B. Zhang, Miniature Bio-Chemical Analytical System Based on Microspectrometer, Photonics West 2005, San Jose Convention Center, Jan. 22-27, 2005, p. 5719-5715.

R.A. Crocombe, D. C. Flanders and W. Atia, "Micro-Optical Instrumentation for Process Spectroscopy", *Proc. of SPIE*, 5591, 2004, pp. 11-25.

Adrian J. Keating, Jarek Antoszewski, Konkaduw K.M.B.D. Silva, Kevin J. Winchester, Thuyen Nguyen, John. M. Dell, Charles A. Musca, Lorenzo Faraone and Olivia Samardzi; Fabry-Perot MEMS Microspectrometers Spanning the SWIR and MWIR', Proc. of SPIE vol. 6542, 65423G, 2007.

C.A Musca, J. Antoszewski, K.J. Winchester, A.J. Keating, T. Nguyen, K.K.M.B.D. Silva, J.M. Dell, L. Faraone, P.Mitra, J. D. Beck, M.R. Skokan, J. E. Robinson, *"Monolithic Integration of an Infrared Photon Detector With a MEMS Based Tunable Filter"*, IEEE Elec. Dev. Letts., vol. 26, No. 12, Dec. 2005, pp. 888-890.

Notice of Allowance for U.S. Appl. No. 13/665,114, Issued Dec. 11, 2014.

Perenzoni et al., "A Monolithic Visible, Infrared, and Terahertz 2D Detector," 2010, 35th International Conference on Infrared, Millimeter, and Terahertz Waves, pp. 1-2.

Entire Patent Prosecution History of U.S. Appl. No. 13/665,114, filed Oct. 31, 2012 , Entitled, "Compact THZ Focal Plane Imaging Arrray With an Integrated Context Imaging Sensors and Antennae Matrix".

Entire Patent Prosecution History of U.S. Appl. No. 13/785,435, filed Mar. 5, 2013 , Entitled, "Compact THZ Imaging Detector With an Integrated Microspectrometer Spectral Tuning Matrix".

Notice of Allowance for U.S. Appl. No. 13/785,435, Issued Sep. 11, 2015.

\* cited by examiner

TERAHERTZ TUNABLE FILTER WITH MICROFABRICATED MIRRORS

CROSS REFERENCE TO RELATED APPLICATIONS

This application is a continuation-in-part of pending U.S. application Ser. No. 13/785,435, filed on Mar. 5, 2013, which is incorporated herein by reference in its entirety for all purposes.

FIELD OF THE INVENTION

The present invention relates, in general, to terahertz (THz) spectroscopy and may be applied to systems with wavelengths ranging from 3 microns (infrared) to 3 mm (millimeter wave) and frequencies ranging from 100 GHz to 100 THz. More specifically, the present invention relates to Fabry-Perot (FP) tunable filters which include microfabricated mirrors that are separated by a variable gap.

BACKGROUND OF THE INVENTION

Mirrors used in high-performance Fabry-Perot (FP) spectrometers for visible and infrared wavelengths often contain multi-layer thin film dielectric stacks to achieve high reflectivity. These thin film mirrors are fabricated using a number of standard vacuum deposition techniques such as evaporation, sputtering or chemical vapor deposition. For teraHertz (THz) optics, however, thin film deposition is challenging since layer thickness scales with increasing wavelength. As the wavelength increases so does the thickness of the deposition layers. Individual layers are typically thicker than 10 microns, depending on wavelength range and refractive index. When attempting to form thicker dielectric films, greater than 10 micron thickness, thin film deposition methods are very time consuming or impractical and, disadvantageously, result in high in-plane stresses. These high stresses result in film cracks and bowed, or curved mirrors.

THz mirrors may be individually assembled from very thin single-crystal silicon layers that are separated from each other by air gaps. These air gaps are defined by mechanical spacers that are made from Mylar, brass, or silicon. In general, the thin silicon layers are stacked one on top of the other, with an air gap between each silicon layer formed by the mechanical spacers. In theory, such THz mirrors may have good wavelength selectivity and optical performance when used for Fabry-Perot spectrometers, lasers, or other THz optical systems. Due to the very large refractive index difference between silicon (n=3.38) and air (n=1), high reflectivity mirrors may be provided using only a few silicon-air gap layer pairs.

In practice, however, conventional assembly processes yield poor optical performance when applied to Fabry-Perot THz mirrors. Using conventional assembly approaches, it is difficult to precisely control the spacing and flatness of a stack of thin and flexible silicon layers, on the order of 10 microns thickness. Single crystal silicon in such thin thickness range is also fragile and brittle, making it difficult to handle.

As disclosed in U.S. Pat. Nos. 7,864,326 and 8,198,590, semiconductor and micro-electromechanical system (MEMS) wafer processing techniques can be used to fabricate THz mirrors with alternating layers of silicon and air. The air gaps are provided by precise spacing of thin silicon supports.

The wafer processing approach leverages unique tools and techniques for repeatable manufacturing of these THz mirrors, thus providing better structural control and lower cost than a conventional assembly process. Furthermore, unlike conventional assembly processes in which devices or components are fabricated serially, one at a time, wafer-level fabrication enables manufacturing of many devices or components simultaneously, in parallel, on a single silicon wafer. The wafer-level fabrication processes for THz mirrors include photolithography and DRIE (deep reactive ion etching) for defining the thin silicon layers and the spacer supports for the air gaps. The fabrication processes include dicing to create individual mirror periods, as well as stacking and bonding the mirror periods together to form the THz mirrors.

The MEMS wafer processing approach, described in the two aforementioned US Patents, provides some improvement in stack spacing and flatness control; however, there are still significant fabrication challenges because of the required wafer thickness. For example, for a mirror design centered at 1 THz, the wafer thickness is approximately 100 microns for a preferred quarter-wave mirror stack design, including both the thin silicon mirror and the spacer support for providing separation control. In general, such thickness of flexible silicon is not practical to handle in manufacturing, which normally uses 150 mm to 300 mm diameter silicon wafers.

Large FP mirrors, such as those needed for use in THz tunable filters with imaging focal plane arrays (FPAs), require precise control of layer to layer separation and good flatness over large optical apertures. These optical apertures may be several centimeters in diameter. The FP mirror components also need to be robust enough so as not to break during fabrication and final assembly. Both the conventional assembly process and wafer-level fabrication suffer from significant challenges in achieving performance and manufacturability requirements for large THz FP mirrors.

There is a need, therefore, for a THz Fabry-Perot tunable filter that has a large optical aperture, good optical performance, and is robust through fabrication and final assembly.

SUMMARY OF THE INVENTION

To meet this and other needs, and in view of its purposes, the present invention provides a terahertz (THz) tunable filter including (a) a first mirror comprised of a first thick silicon substrate and a first thin silicon membrane, wherein the first thin silicon membrane is fixed to the first thick silicon substrate by first patterned supports, and (b) a second mirror comprised of a second thick silicon substrate and a second thin silicon membrane, wherein the second thin silicon membrane is fixed to the second thick silicon substrate by second patterned supports. The first thin silicon membrane is oriented facing the second thin silicon membrane, and a variable gap is provided between the first and second thin silicon membranes.

The first patterned supports are configured to provide a first fixed gap between the first thin silicon membrane and first thick silicon substrate; and the second patterned supports are configured to provide a second fixed gap between the second thin silicon membrane and second thick silicon substrate. The first and second fixed gaps each have a thickness dimension that is smaller than a thickness dimension of the variable gap. The thickness dimension is defined by a vertical line passing through the first and second mirrors.

The first and second patterned supports are arranged to form a plurality of cells, in which each cell is configured in a grid formation. The grid formation is arranged in one of an hexagonal grid, a triangular grid, a rhombus grid, a rectangular grid, and a square grid. Each cell includes a thickness dimension that is smaller than an optical wavelength, and a width dimension that is larger than the optical wavelength. The thickness dimension is defined by a vertical line passing through the first and second mirrors, and the width dimension is defined by a horizontal line that is perpendicular to the vertical line. The width dimension of each cell is larger than the thickness dimension of each cell by at least ten times (10λ).

The tunable filter further includes (a) a first anti-reflective (AR) layer disposed on the first thick silicon substrate, and (b) a second AR layer disposed on the second thick silicon substrate. The first AR layer and the second AR layer are at opposite ends of the tunable filter. The tunable filter further includes a rigid frame of silicon surrounding the tunable filter for user handling or manufacturing purposes. The tunable filter further includes a piezoelectric actuator coupled to at least one of the first and second mirrors for selecting a separation distance between the first and second thin silicon membranes that form the variable gap.

The first mirror may include another thin silicon membrane, where the other thin silicon membrane is fixed to the first thin silicon membrane by other supports. The second mirror may include yet another thin silicon membrane, where the yet other thin silicon membrane is fixed to the second thin silicon membrane by yet other supports. The variable gap may then be provided between the other thin silicon membranes.

Another embodiment of the present invention includes a terahertz (THz) imaging device having (a) a tunable filter for receiving optical wavelengths of light and selectively transmitting at least one optical wavelength of light, and (b) a focal plane array (FPA) for receiving the at least one optical wavelength of light selectively transmitted from the tunable filter. The tunable filter includes (c) a first mirror comprised of a first thick silicon substrate and a first thin silicon membrane, wherein the first thin silicon membrane is fixed to the first thick silicon substrate by first patterned supports, and (d) a second mirror comprised of a second thick silicon substrate and a second thin silicon membrane, wherein the second thin silicon membrane is fixed to the second thick silicon substrate by second patterned supports. The first thin silicon membrane is oriented facing the second thin silicon membrane, and a variable gap is provided between the first and second thin silicon membranes.

The first patterned supports are configured to provide a first fixed gap between the first thin silicon membrane and first thick silicon substrate, and the second patterned supports are configured to provide a second fixed gap between the second thin silicon membrane and second thick silicon substrate. The first and second patterned supports are arranged to form a plurality of cells, in which each cell is configured in a grid formation. The grid formation is arranged in one of an hexagonal grid, a triangular grid, a rhombus grid, a rectangular grid, and a square grid.

Yet another embodiment of the present invention is a method of making a terahertz (THz) tunable filter. The methods includes the steps of:

coating a photoresist layer on a first silicon wafer;

etching the first silicon wafer and stripping the photoresist layer to form a pattern of protruding support cells on a silicon substrate;

attaching a second silicon wafer to the protruding support cells on the silicon substrate; and etching the second silicon wafer to form a membrane spaced by a fixed gap from the silicon substrate. The membrane, the silicon substrate, and the fixed gap form one mirror of a Fabry-Perot (FP) tunable filter.

The method further includes:

forming another mirror of the FP tunable filter using the previous steps of claim 15; and separating, by a variable gap, the one mirror formed in the previous steps of claim 15 from the other mirror. The variable gap is disposed between the membranes of the respective mirrors as each faces the other.

The second silicon wafer of the method is a silicon-on-insulator (SOI) wafer that includes a thick sacrificial handle, a buried oxide layer and a thin silicon layer. Furthermore, the step of etching the second silicon wafer to form a membrane includes removing the buried oxide layer to expose the thin silicon layer.

Still another embodiment of the present invention is a terahertz (THz) tunable filter having an optical aperture for selectively transmitting light. The filter includes (a) a first mirror comprised of a first thick silicon substrate and a first thin silicon layer, wherein the first thin silicon layer is held in place by a first supporting structure within the optical aperture, and (b) a second mirror comprised of a second thick silicon substrate and a second thin silicon layer, wherein the second thin silicon layer is held in place by a second supporting structure within the optical aperture. The first thin silicon layer is oriented facing the second thin silicon layer, and a variable gap is provided between the first and second mirrors.

The first supporting structure includes a first series of patterned supports and the second supporting structure includes a second series of patterned supports. The first and second series of patterned supports are made of silicon. The first and second supporting structure may each include a thin organic layer.

In addition, the first mirror may include another thin silicon layer, in which the other thin silicon layer is fixed to the first thin silicon layer by another supporting structure; and the second mirror may include yet another thin silicon layer, in which the yet other thin silicon layer is fixed to the second thin silicon layer by yet another supporting structure. A variable gap is then provided between the first and second mirrors.

It is understood that the foregoing general description and the following detailed description are exemplary, but are not restrictive, of the invention.

BRIEF DESCRIPTION OF THE FIGURES

The invention may be understood from the following detailed description when read in connection with the accompanying figures:

FIG. 1b is a top view of the THz tunable filter shown in FIG. 1a.

FIG. 1c is a magnified side view of a portion of the THz tunable filter shown in FIG. 1a.

FIG. 5b is a magnified side view of a portion of the THz tunable filter shown in FIG. 5a.

DETAILED DESCRIPTION OF THE INVENTION

The present invention provides a THz Fabry-Perot (FP) mirror design that is compatible with applications requiring large optical apertures and good optical performance. As will be described, the present invention includes one or more thin silicon layers which are supported at multiple locations within the optical aperture. In addition, robustness is improved through fabrication and final assembly, by employing a thick supporting wafer throughout the fabrication process. The present invention overcomes the difficulties noted above, by providing precise control of layer-to-layer separation, improved mirror flatness, and increased area for the THz FP mirrors that result in large optical apertures.

Figure 1A:
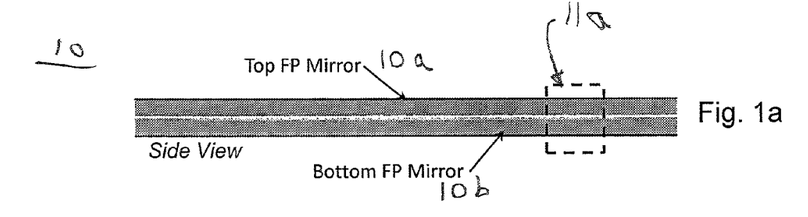
FIG. 1a is a side view of a THz tunable filter, including top and bottom FP mirrors with support structures having an hexagonal shape, in accordance with an embodiment of the present invention.
Figure 1B:
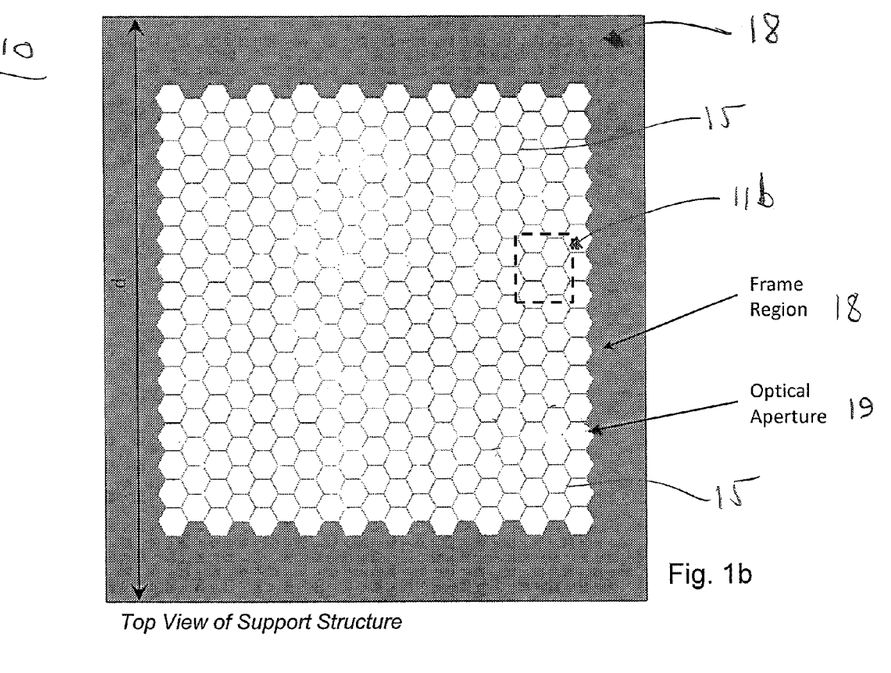
Figure 1C:
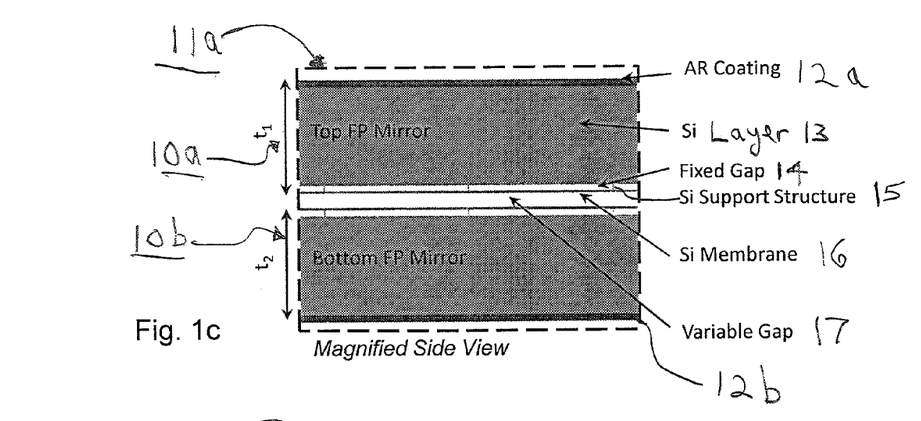
Figure 1D:
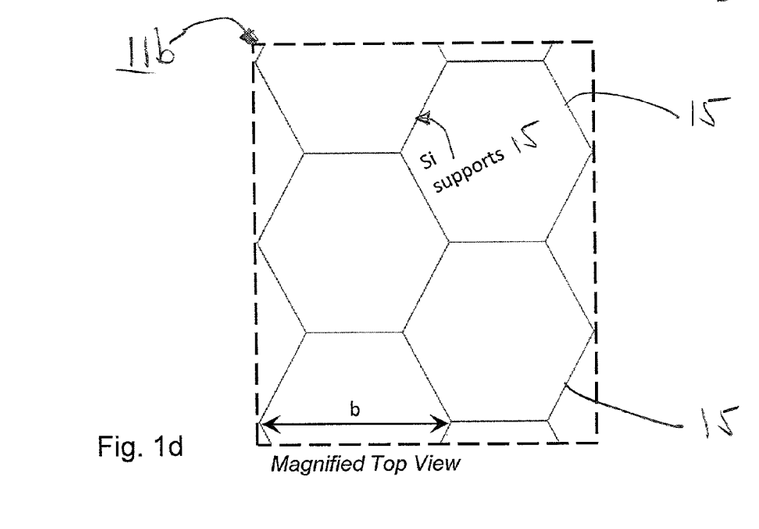
FIG. 1d is a magnified top view of a portion of the THz tunable filter shown in FIG. 1b.

FIGS. 1a and 1c depict a side view of one embodiment of the THz tunable filter of the present invention, designated generally as 10. Two magnified views of portions of tunable filter 10, designated as regions 11a and 11b, are shown in FIGS. 1c and 1d, respectively. FIG. 1c is a magnified view of region 11a as a side view, and FIG. 1d is a magnified view of region 11b as a top view of the silicon support structure 15. These four figures show the detailed structure of two FP mirrors, namely a top FP mirror 10a and a bottom FP mirror 10b. The top and bottom FP mirrors are separated by a variable gap, designated as 17. The variable gap 17 is configured to be varied in thickness in order to tune the tunable filter 10 for a desired transmitted THz frequency or multiple frequencies, as described later with respect to FIG. 3.

Each of the FP mirrors 10a, 10b includes a thick rigid silicon substrate 13 and a thin silicon membrane 16. The thin silicon membrane 16 is held above the thick silicon substrate 13 by a gridded mesh of micro-machined silicon supports, designated as 15. A fixed spacing 14, or a fixed gap 14 is formed between the thin membrane 16 and the thick substrate 13 because of the silicon supports. The thickness of the thin silicon membrane 16 and the thickness of the fixed gap 14 separating the membrane from the silicon substrate layer 13 are designed and selected based on a user's desired spectral range. Antireflection (AR) coatings on opposite sides of the thick silicon layer 13 reduce undesirable reflections at the exterior air-silicon interfaces. For example, AR coating 12a and AR coating 12b are shown deposited on top of each silicon layer 13, at opposite ends of tunable filter 10.

FIGS. 1b and 1d show top views of the micro-fabricated support structure 15, which is disposed between the thin membrane 16 and the thick silicon layer 13 for forming the fixed gap 14. It will be understood, as shown, that the top FP mirror 10a includes support structure 15 for forming a fixed gap 14 and, similarly, bottom FP mirror 10b includes another support structure 15 for forming another fixed gap 14. In the embodiment shown in FIGS. 1b and 1d, a narrow hexagonal support grid is used to provide good mechanical stability throughout optical aperture 19. The hexagonal support grid is preferably comprised of silicon, but alternatively may be formed from other suitably patterned materials.

Figure 2:
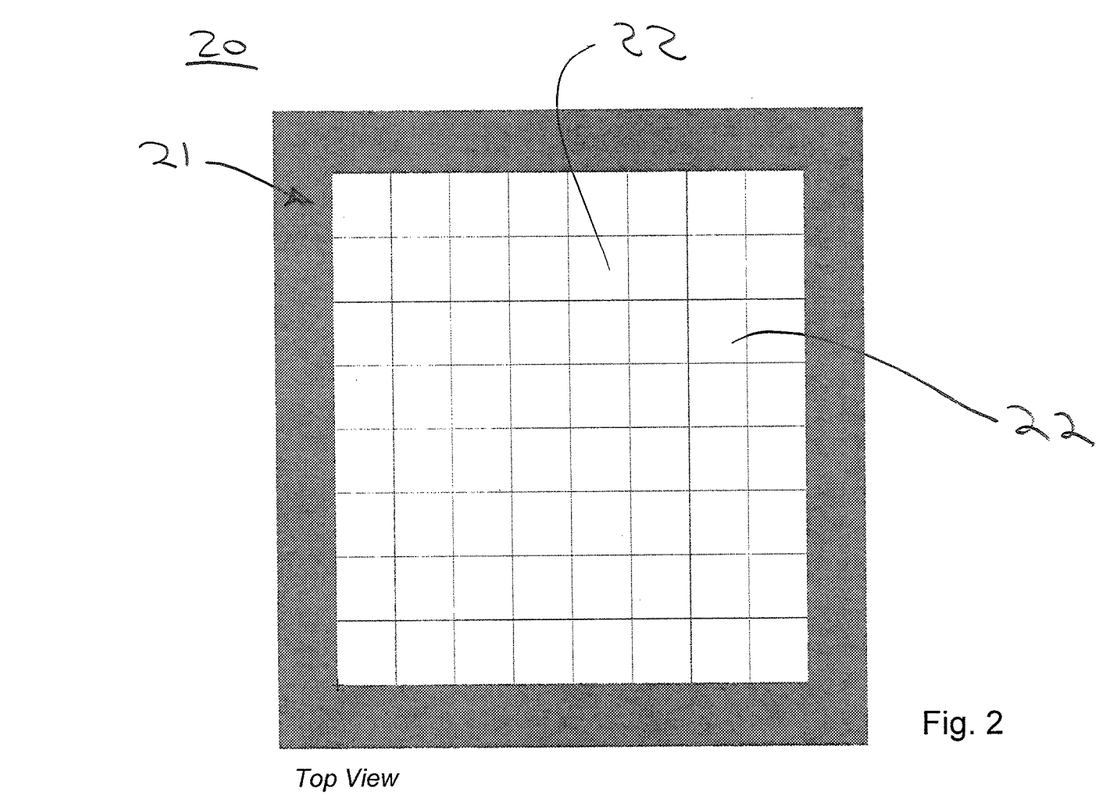
FIG. 2 is a top view of a THz tunable filter showing a support structure having a rectangular or square shape, in accordance with another embodiment of the present invention.

In order to minimize degradation in optical performance, the support-free regions, or the air gap regions formed in the enclosed perimeters defined by the silicon support grid are kept as large as possible, while still providing the needed mechanical support. For example, the hexagonal gridded support structure 15 shown in FIGS. 1b and 1d has a width 'b' of 2 mm. The thickness of the hexagonal gridded support structure 15, on the other hand, is preferably much smaller than the optical wavelength, or much smaller than 300 um for a frequency of 1 THz (for example). Other microstructures forming supports may be used to provide support for the thin membrane. For example, a series of isolated silicon posts may be used, or a square gridded support, as shown in FIG. 2, may be employed. As shown, tunable filter 20 of the present invention includes a grid form in the shape of a square. The square gridded support structure is designated as 22.

Although not shown, it will be appreciated that other gridded forms may be used to provide support for the thin silicon membrane. For example, a triangular grid, a rectangular grid, or a rhombus-shaped grid may be used. All these grid structures have a common element in that all form a completely closed cell having a fixed enclosed boundary, with a boundary of one cell sharing a boundary of an adjacent cell. The area formed within each cell is similar to an area formed within its adjacent cell in the gridded structure.

A frame is formed surrounding each optical aperture of the tunable filter. A frame, designated as 18, is shown in FIG. 1b, which surrounds the gridded hexagonal structure 15 of tunable filter 10. The frame forms a perimeter for optical aperture 19 which may be used by a user for handling purposes. The frame region at the perimeter of the optical aperture is solid silicon. Similarly, a frame 21 is shown in FIG. 2, which surrounds the gridded square structure 22 of tunable filter 20.

Figure 3:
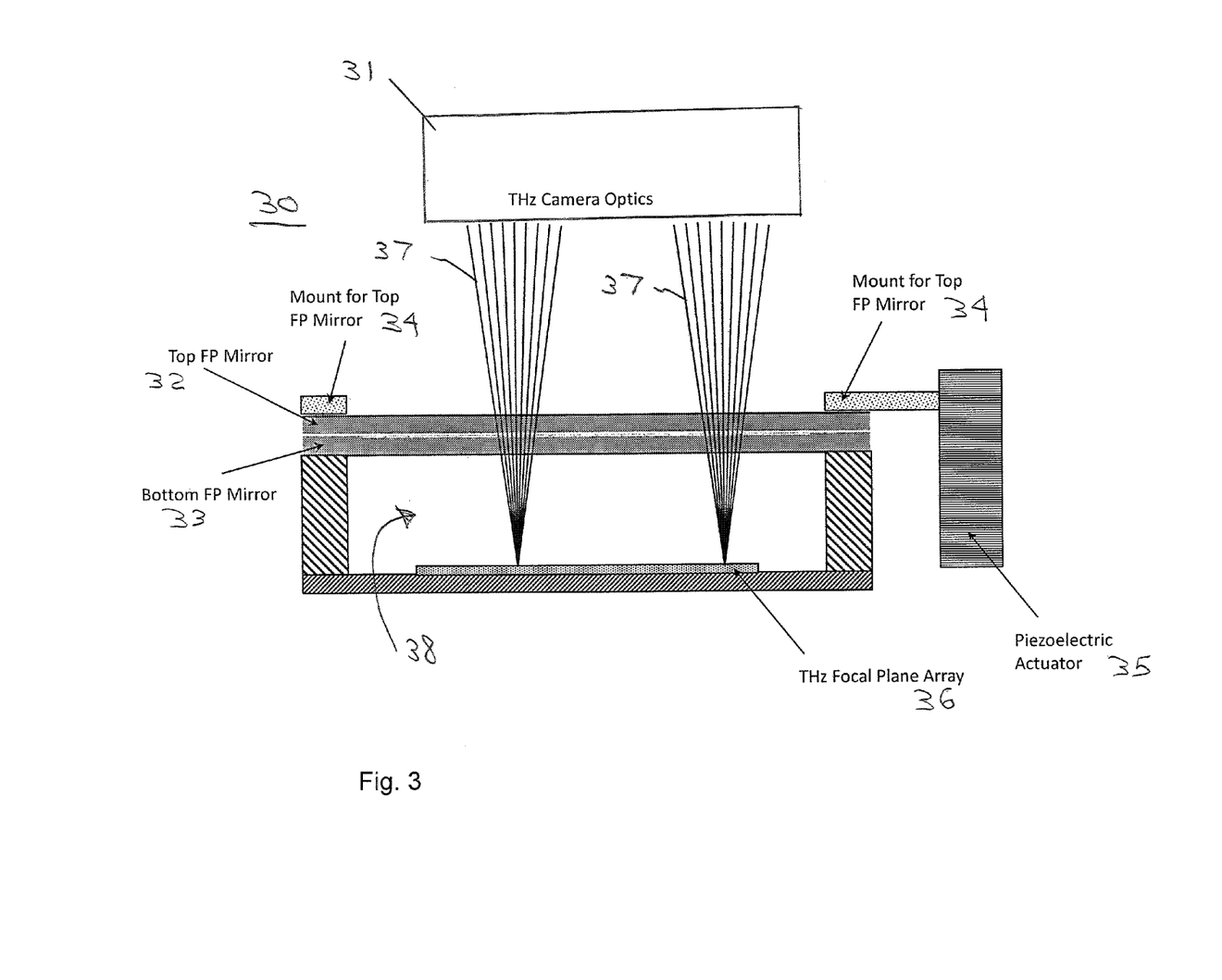
FIG. 3 is a diagram of an F/2 optical system including a THz tunable filter, in accordance with an embodiment of the present invention.

As an example of the present invention, a THz FP tunable filter for use in an F/2 optical system is shown in FIG. 3. The THz FP tunable filter is used with a THz focal plane array (FPA) positioned at the image plane of THz camera optics 31. As shown, imaging system 30 includes camera optics 31 (shown without detail), a pair of FP mirrors (top FP mirror 32 and bottom FP mirror 33) and a THz FPA 36.

Also included in optical system 30 are mirror mounts 34, which allow coupling to piezoelectric actuator 35. It will be understood that top FP mirror 32 includes a thick silicon layer 13 and a thin silicon membrane 16 which are separated by a fixed gap 14 by way of silicon support structure 15 (refer to FIG. 1c). Similarly, bottom FP mirror 33 includes a thick silicon layer 13 and a thin silicon membrane 16 which are separated by a fixed gap 14 by way of silicon support structure 15. A variable gap 17 is formed between top FP mirror 32 and bottom FP mirror 33, which may be tuned to a variable thickness by way of piezoelectric actuator 35.

The external piezoelectric actuator 35, because it is coupled to the top FP mirror 32, moves the top FP mirror 32, thereby varying the variable gap that determines the transmitted THz band. The bottom FP mirror 33 is kept stationary. Piezoelectric actuators with the desired range of motion are conventionally used to focus microscope objectives, and may readily be adapted to control the variable gap of the tunable filter shown in FIG. 3.

For an exemplary FP tunable filter designed for a tuning range from 0.75 to 1.5 THz, each of the two FP mirrors includes a silicon membrane that is 18.3 um thick (this is a quarter-wave thickness in silicon for a 250 um wavelength) and is supported by a hexagonal silicon grid at a distance of 62.5 um (quarter-wave separation in air for 250 um wavelength) from the thick silicon substrate layer. The two silicon substrate layers may have the same thickness. Better performance is achieved, however, by carefully selecting different thicknesses to minimize the impact of residual reflections at the exterior AR coated surfaces.

In the exemplary filter shown in FIG. 3, one silicon substrate layer is 951.0 um thick and the other silicon substrate layer is 914.4 urn, corresponding to 13 and 12.5 waves in silicon, respectively. In order to achieve a tuning range from 0.75 to 1.5 THz, the variable gap 17 (FIG. 1c) between the two FP mirrors 32 and 33 is tuned between approximately 90 um and 220 um.

As an example of operating parameters, the tunable filter of imaging system 30 selectively transmits a narrow, 38.5 GHz band, over a 0.75 to 1.5 THz tuning range. The transmission (shown as light rays 37) is provided in approximately 20 independent spectral bands, across the 750 GHz tuning bandwidth. The center of each spectral band can be tuned to within a few GHz.

Although it is difficult to see, the two FP mirrors include two respective AR layers (not labeled in FIG. 3). As best shown in FIG. 1c, however, AR coatings 12a and 12b are included in the two FP mirrors shown in FIG. 3. As an example, each AR layer may actually be comprised of two layers. The first inner layer on the silicon surface is 22.7 um thick with a refractive index of 2.75, and the second outside layer is 41.7 um thick with a refractive index of 1.5.

There are multiple approaches for making AR coatings for the THz FP mirrors. A low index coating layer may be made from an organic material such as polyethylene, polypropylene, polystyrene, parylene, SU-8, topaz, or PMMA (poly methyl methacrylate). A high index coating layer may be made by loading an organic material with sub-wavelength particles of silicon, or other sub-wavelength particles with a high refractive index. Alternatively, a high index layer may be made from a thin layer of fused silica or glass, such as Pyrex or BK7; this thin layer may be made by bonding a wafer to the silicon substrate and then grinding and polishing down to the desired thickness of the thin layer. The AR coatings, preferably, have low THz absorption characteristics and, as such, the AR coating materials need to be selected appropriately. Other options for making AR coatings for THz mirrors include forming a sub-wavelength structured surface on a silicon substrate by micromachining, or simply using a single layer coating, such as parylene.

The dimensions of the THz tunable filter depend on application requirements for the optical system. The FP mirror thicknesses, $t_1$ and $t_2$ (shown as 10a and 10b in FIG. 1c, respectively) may be in the range of 200 um to 5 mm. Preferably, each FP mirror should have an overall thickness greater than 400 um for improved robustness and increased rigidity, but an overall thickness less than 2 mm for processing compatibility with standard production tools in silicon wafer foundries. The FP mirror's shape is selected to match optical-mechanical system needs, including mounting requirements to an external actuator (such as actuator 35 shown in FIG. 3) for selectively tuning the variable gap.

In the example shown in FIG. 1b, the THz tunable filter 10 is approximately 4×4 cm in size (length×width) with a 3×3 cm (length×width) optical aperture 19, each cell of the hexagonal grid has a diameter 'b' of 2 mm (shown in FIG. 1d), and the silicon supports are 20 um wide. The width of the silicon support structure is preferably formed as narrow as practical, limited only by fabrication aspects, such as photolithography resolution, the undercut formed during deep reactive ion etching, and minimum surface area required for good bonding of the support structure to the thin silicon membrane. The diameter 'b' of each hexagonal cell, on the other hand, is preferably as large as practical, so as to minimize optical performance degradation.

Although only one thin silicon membrane is shown on each of the two FP mirrors, additional silicon membranes with additional support structures may be added to each FP mirror in order to increase filter finesse. For the exemplary tunable filter 10 shown in FIG. 1c, an additional second membrane with an additional second support structure on each FP mirror may reduce the transmitted bandwidth by more than a factor of 10 (from 25.9 GHz to 2.4 GHz for a highly collimated beam).

A method of making each of the FP mirrors of the THz tunable filter will now be described by reference to a fabrication sequence 40 (method 40) shown in FIGS. 4a through 4f. These figures show steps in the wafer fabrication sequence for forming the FP mirrors of the THz tunable filter. First, a high-resistivity float zone silicon wafer 41 (FIG. 4a) with low THz absorption is coated with photoresist (not shown). The resist is exposed and developed in the pattern of the support structure (hexagonal gridded cells, for example). The patterned photoresist forms a mask for deep reactive ion etching (DRIE) of the silicon wafer 41. After performing DRIE to a depth required for the support structure, the photoresist is stripped, thereby resulting in the structure shown in FIG. 4b. This structure now includes a thick silicon substrate layer 42 with a silicon support structure 43. The thickness of the silicon support structure is determined by the DRIE processing parameters (etch rate and etch time).

Figures 4A, 4B, 4C, 4D, 4F:
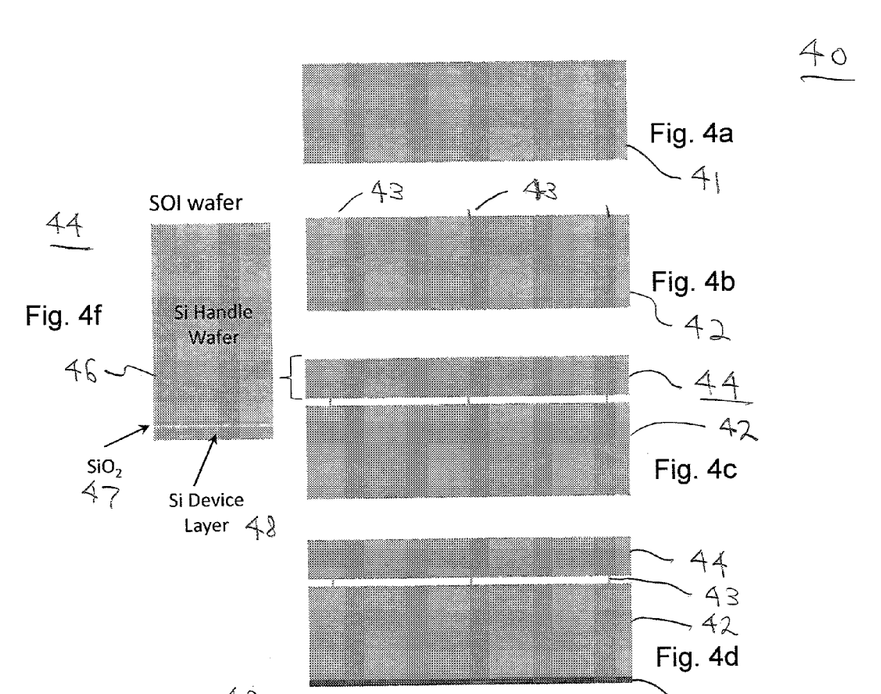
FIGS. 4a, 4b, 4c, 4d, 4e and 4f show various stages in making a THz tunable filter, in accordance with an embodiment of the present invention.
Figure 4E:
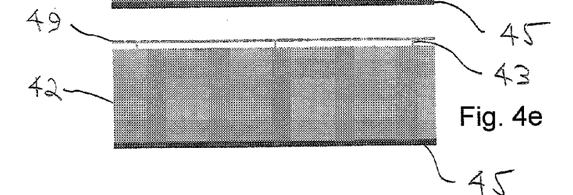

Next in the fabrication process, a second silicon wafer, shown as SOI wafer 44 in FIG. 4f, is attached to the support structure 43, as shown in FIG. 4c. The attachment may be performed by fusion bonding to the support structure and the surrounding silicon frame (the latter not shown). Other bonding techniques may be used to attach these two wafers, for example, by using adhesives, eutectics, or metal thermocompression. As best shown in FIG. 4f, the second wafer is a custom silicon-on-insulator (SOI) wafer with a thick sacrificial silicon handle 46, a buried oxide layer 47, and a thin device silicon layer 48. The buried oxide layer 47 serves as an etch stop for removing the sacrificial silicon handle wafer 46.

After bonding the silicon support structure 43 to the second wafer 44, an AR coating 45 is applied to the opposite end, or bottom end of the bonded wafer pair, as shown in FIG. 4d. Finally, the silicon handle wafer 46 and the buried oxide layer 47 are removed by way of a dry or wet etching process, leaving only the desired silicon device layer 48. The desired silicon device layer 48 forms the suspended thin silicon membrane, shown in FIG. 4e as silicon membrane 49. It will be appreciated that fabrication process 40 provides one of the two THz mirrors, both of which are shown in FIGS. 1a through 1d. The second mirror may be fabricated in the same manner as the first mirror by using process 40.

The fabrication process 40 provides very good control of the final silicon membrane thickness, since the buried oxide layer provides an excellent etch stop for etching the handle wafer 46. Furthermore, custom SOI wafers with device layer thickness tolerances of +/−1 um (or better) are readily available and are sufficient to meet requirements for the THz mirrors.

An optional step in the fabrication process (not shown) uses photolithography and etching of a small vent hole in the thin silicon membrane 49 in order to equalize pressure. Another step (not shown) is dicing the structure formed by process 40 in FIG. 4e into individual FP mirrors. The final dicing step needs to be performed with care to avoid damaging the delicate thin silicon membrane. There are a number of dicing techniques developed specifically for MEMS devices that may be employed. It will be appreciated that throughout the fabrication sequence, shown in FIGS. 4a-4f, at least one side of the wafer is robust and may, advantageously, be handled by standard wafer production tools.

A variety of alternative processes may be used to fabricate the FP mirror structure shown in FIGS. 1a through 1d. For example, for more precise control of the geometry of the silicon support structure, another silicon-on-insulator (SOI) wafer with a high-resistivity float zone handle may be used as the starting material fabrication process shown in FIGS. 4a and 4b. Thus, wafer 41 may be similar to the SOI wafer 44 shown in FIG. 4f, but with a thickness for the silicon device layer equal to the desired thickness of the silicon support structure. Instead of the processes shown in FIGS. 4a and 4b, the fabrication sequence then includes DRIE etching of the support structure into the (support structure) silicon device layer and etching of the buried oxide. The end result is more precise control of thickness and uniformity of the support structure than in the original sequence. The remainder of the fabrication flow in FIGS. 4c-4f is unchanged.

Figure 5A:
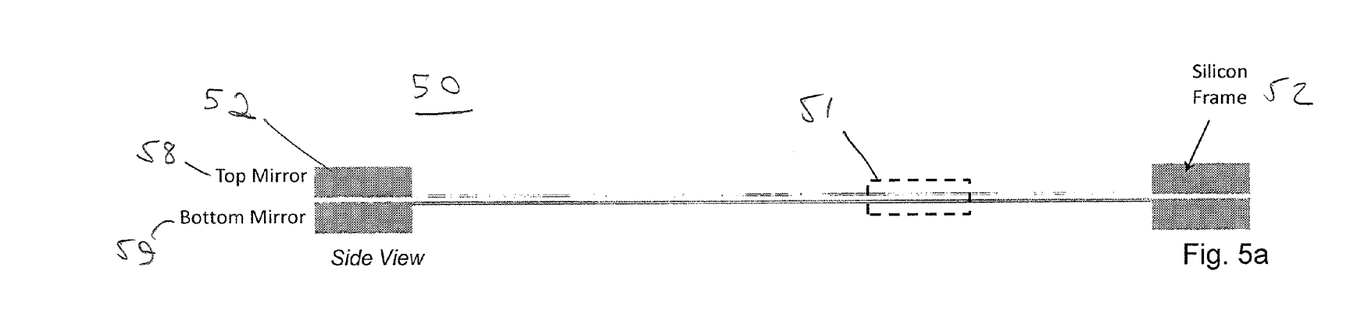
FIG. 5a is a side view of a THz tunable filter, including top and bottom FP mirrors, each mirror having multiple support structures, in accordance with another embodiment of the present invention.
Figure 5B:
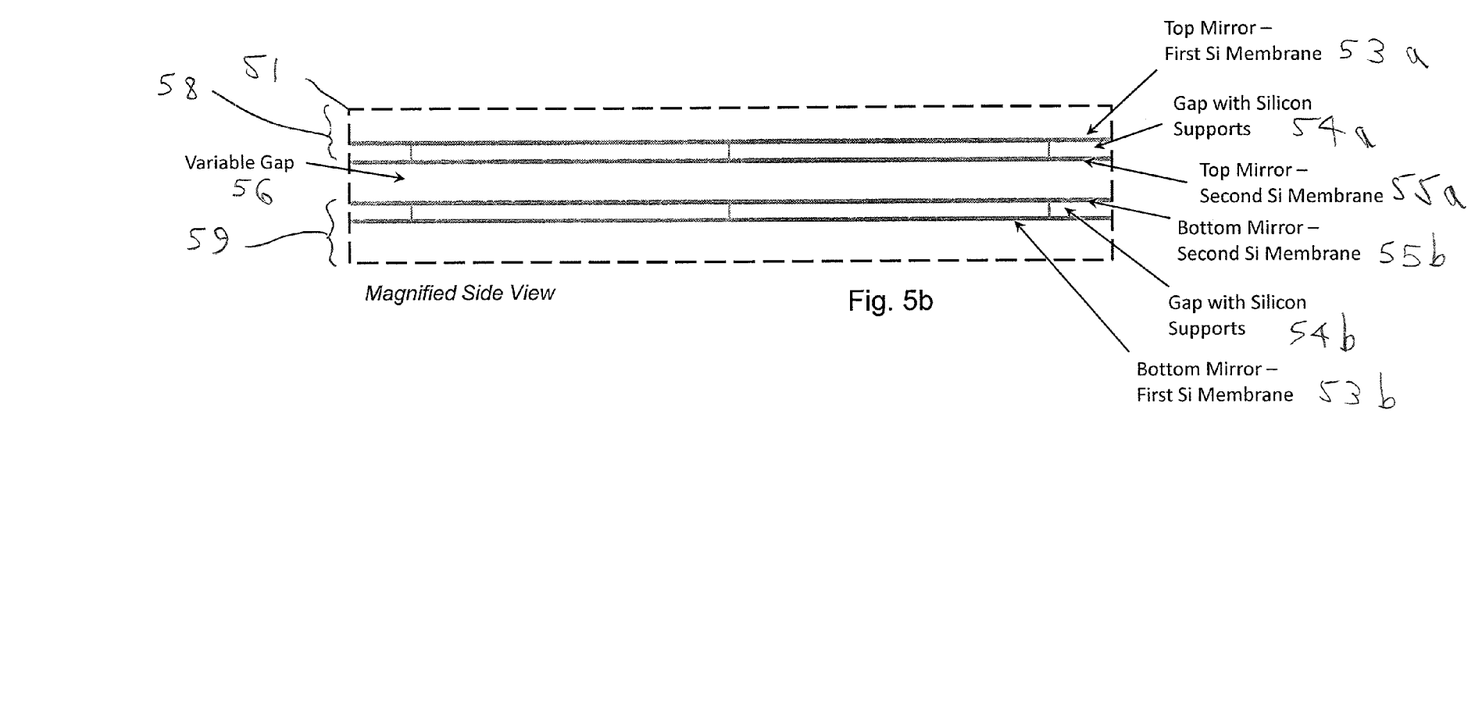

Referring now to FIGS. 5a and 5b, another embodiment of the THz tunable filter is shown as THz tunable filter 50. FIG. 5a depicts a side view of the embodiment, including the silicon frame 52, whereas FIG. 5b is a magnified view of portion 51 of FIG. 5a. As shown, each of the two FP mirrors (top mirror 58 and bottom mirror 59) includes a pair of thin silicon layers bonded to each other through a silicon support structure. More particularly, the top mirror 58 includes a first silicon membrane 53a and a second silicon membrane 55a, which are separated by a first support structure that forms a first fixed gap, designated as 54a. Similarly, the bottom mirror 59 includes a second silicon membrane 53b and a second silicon membrane 55b, which are separated by a second support structure that forms a second fixed gap, designated as 54b. Similar to the embodiment shown in FIGS. 1a through 1d, a variable gap 56 is provided between the top mirror 58 and the bottom mirror 59.

The two silicon support structures shown in FIGS. 5a and 5b, which provide for two fixed gaps (54a and 54b) improve the overall stiffness, flatness, robustness, and relative separation of the suspended and bonded thin membranes within each FP mirror. The variable gap 56 between the two FP mirrors is controllable to enable tuning of the transmitted spectral band (similar to the embodiment shown in FIGS. 1 and 3). Similar to frame 18 shown in FIG. 1b and frame 21 shown in FIG. 2, the tunable filter 50 includes a thick silicon frame 52 at the edge of the optical aperture region for handling and assembly purposes. It will be understood that tunable filter 50 is more fragile than the tunable filter 10 of FIGS. 1a-1d. However, tunable filter 50 provides higher finesse and does not require AR coatings.

Figure 6:
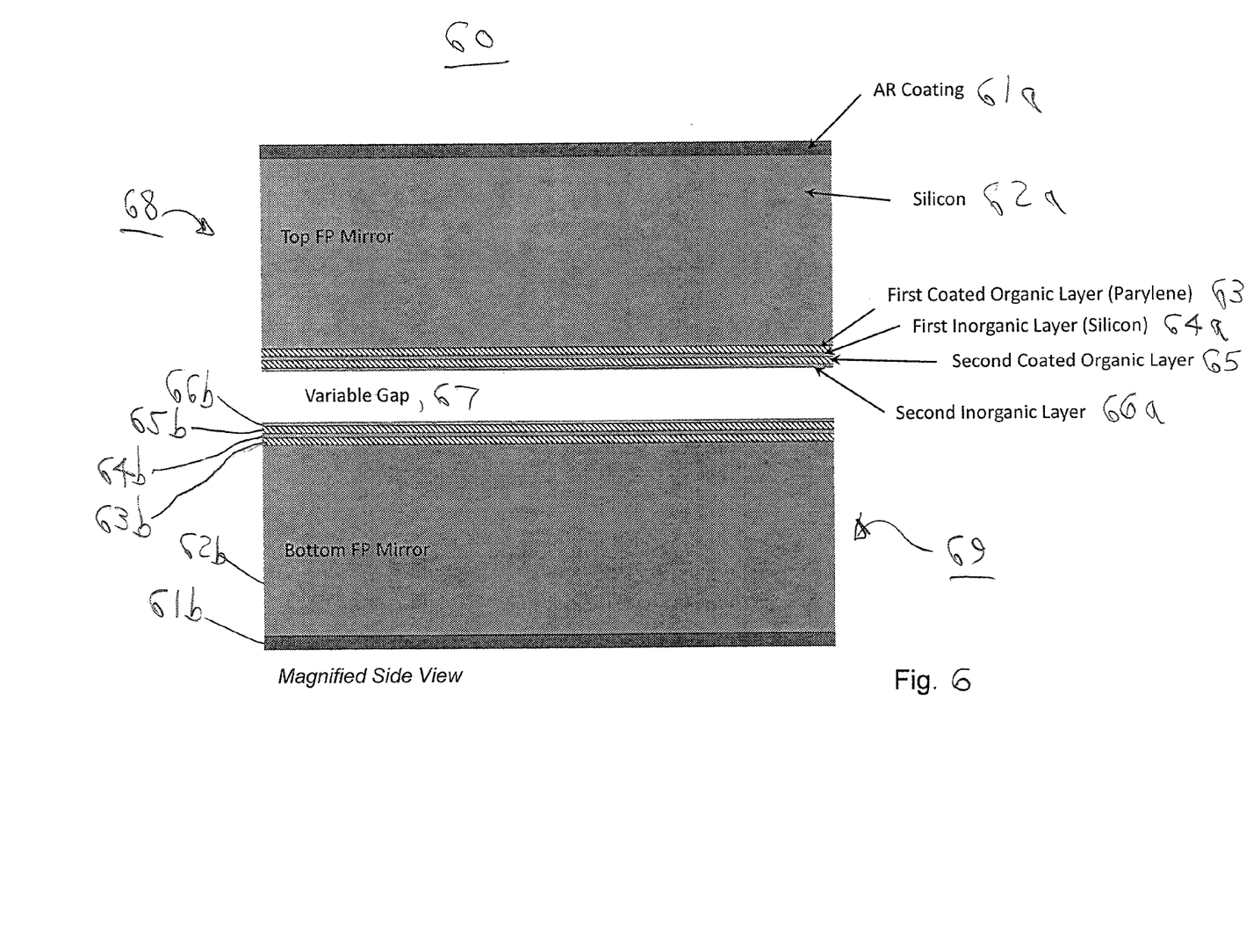
FIG. 6 is a magnified side view of a THz tunable filter, including top and bottom FP mirrors, each mirror having organic coated layers as supporting structures, in accordance with yet another embodiment of the present invention.

Yet another embodiment of the present invention is shown in FIG. 6 as THz tunable filter 60. As shown, each of the two FP mirrors, namely, top mirror 68 and bottom mirror 69, includes two or more thin silicon layers separated from the silicon substrate and each other by a thin organic layer, such as polyethylene, polypropylene, polystyrene, parylene, SU-8, topaz, or PMMA. More specifically, top mirror 68 includes a thick silicon layer 62a, followed by a first thin silicon layer (or membrane) 64a and a second thin silicon layer (or membrane) 66a. Separating the thick silicon layer 62a from the first thin silicon layer 64a is a first coated organic layer 63a; separating the first thin silicon layer 64a from the second thin silicon layer 66a is a second coated organic layer 65a. Similarly, bottom mirror 69 includes a thick silicon layer 62b, followed by a first thin silicon layer (or membrane) 64b and a second thin silicon layer (or membrane) 66b. Separating the thick silicon layer 62b from the first thin silicon layer 64b is a first coated organic layer 63b; separating the first thin silicon layer 64b from the second thin silicon layer 66b is a second coated organic layer 65b. In addition to the aforementioned layers, top FP mirror 68 includes an AR coating 61a and bottom FP mirror 69 includes an AR coating 61b, each disposed at opposite ends of the tunable filter 60. A variable gap 67 is formed between top FP mirror 68 and bottom FP mirror 69 for selectively tuning the transmitted spectral band (in a manner that is similar to tuning the spectral band of imaging system 30 in FIG. 3).

Other variations of the present invention are possible. For example, instead of using a silicon support structure (gridded cell structure) in the embodiment of FIGS. 1a through 1d, the support structure may be formed using an organic layer that is patterned through photolithography and etching, or an organic layer that may be directly patterned through photolithography, such as an SU-8 organic layer. Alternatively, a composite material with an engineered low refractive index may be used to support the thin silicon membrane. For THz frequencies, this low index material may include small silicon posts separated from each other by a distance that is much smaller than the operational wavelength transmitted by the filter. As another example, the composite material may be an aerogel.

Figure 7:
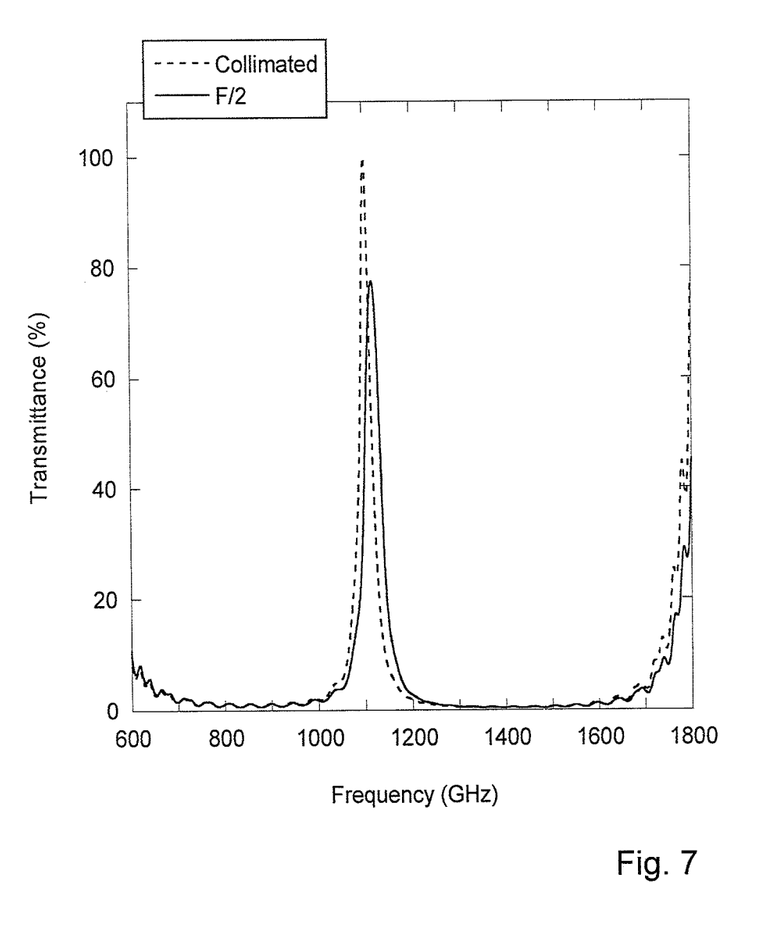
FIG. 7 is a plot of optical transmittance as a function of frequency for an exemplary tunable filter in accordance with an embodiment of the present invention.
Figure 8A:
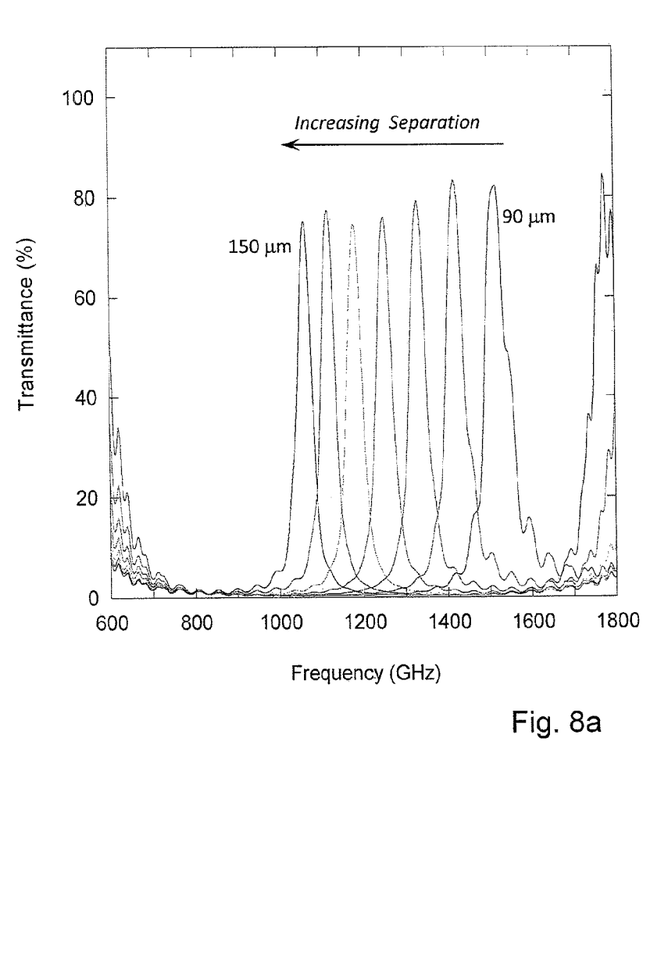
FIG. 8a is a plot of optical transmittance as a function of frequency for an exemplary tunable filter as it is tuned across a spectral band, showing increasing separation of a variable gap between top and bottom FP mirrors in the filter.
Figure 8B:
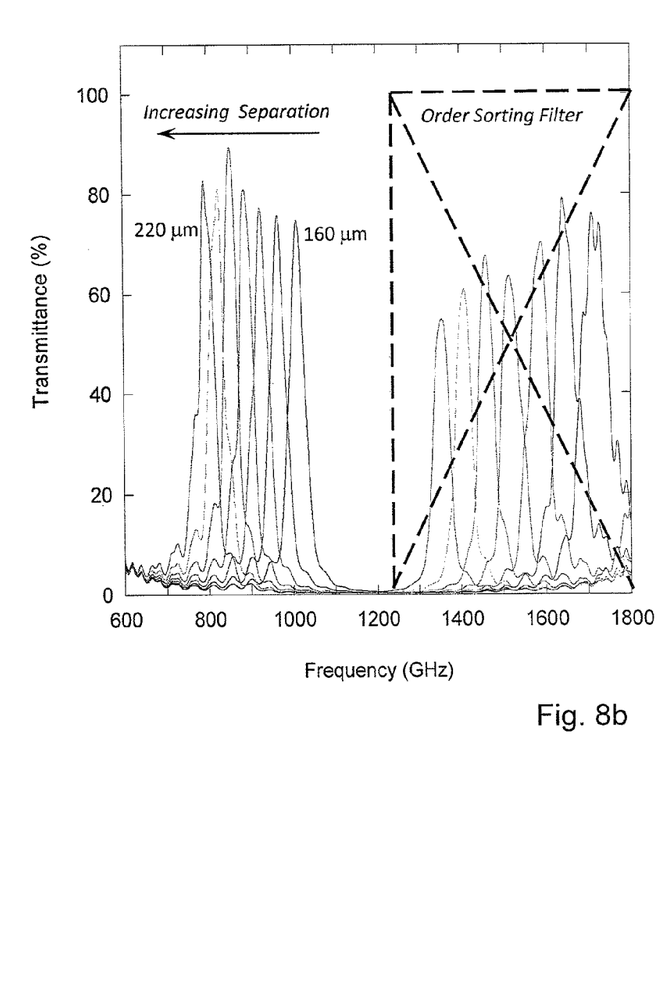
FIG. 8b is another plot of optical transmittance as a function of frequency for an exemplary tunable filter as it is tuned across a spectral band, showing increasing separation of a variable gap between top and bottom FP mirrors in the filter.

FIGS. 7, 8a and 8b depict plots of modeled optical transmittance for the exemplary tunable filters described above to provide a tuning range from 0.75 THz to 1.5 THz and suitable for THz imaging spectroscopy. The plots in FIG. 7 correspond to a fixed separation of 140 um in the variable gap provided between the two thin silicon membranes on opposing FP mirrors. This exemplary tunable filter is well-suited for use in relatively fast optical systems, as may be appropriate for imaging spectroscopy applications. The full spectral width at half maximum of the transmitted band is 25.9 GHz for a collimated beam (dashed line), 29.4 GHz for an F/3 optical system (not shown) and 38.5 GHz for an F/2 system (solid line).

The plots shown in FIGS. 8a and 8b depict variable tuning of the transmitted spectral band by adjusting the separation distance in the variable gap between the top and bottom FP mirrors. At lower frequencies and larger gap separations (FIG. 8b), an order sorting filter (not shown) may be needed to prevent unwanted transmission of higher order bands. The order-sorting filter can be selectively inserted into the optical system to block higher frequency bands (frequencies above approximately 1250 GHz in FIG. 8b), when passing lower frequency bands (frequencies below approximately 1050 GHz in FIG. 8b).

With respect to imaging systems, the present invention may be applied to a variety of THz spectroscopy applications, such as security screening, explosive detection, non-destructive testing and materials characterization. Although described in detail for THz systems, the invention may also be applied to systems with wavelengths ranging from 3 um (infrared) to 3 mm (millimeter wave), or frequencies ranging from 100 GHz to 100 THz.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A terahertz (THz) tunable filter comprising:
a first mirror comprised of a first thick silicon substrate and a first thin silicon membrane, wherein the first thin silicon membrane is fixed to the first thick silicon substrate by first patterned supports, and
a second mirror comprised of a second thick silicon substrate and a second thin silicon membrane, wherein the second thin silicon membrane is fixed to the second thick silicon substrate by second patterned supports,
wherein the first thin silicon membrane is oriented facing the second thin silicon membrane, and
a variable gap is provided between the first and second thin silicon membranes.

2. The tunable filter of claim 1 wherein
the first patterned supports are configured to provide a first fixed gap between the first thin silicon membrane and first thick silicon substrate, and
the second patterned supports are configured to provide a second fixed gap between the second thin silicon membrane and second thick silicon substrate.

3. The tunable filter of claim 2 wherein
the first and second fixed gaps each have a thickness dimension that is smaller than a thickness dimension of the variable gap, and
the thickness dimension is defined by a vertical line passing through the first and second mirrors.

4. The tunable filter of claim 2 wherein
the first and second patterned supports are arranged to form a plurality of cells, in which each cell is configured in a grid formation.

5. The tunable filter of claim 4 wherein
the grid formation is arranged in one of an hexagonal grid, a triangular grid, a rhombus grid, a rectangular grid, and a square grid.

6. The tunable filter of claim 4 wherein
each cell includes a thickness dimension that is smaller than an optical wavelength, and a width dimension that is larger than the optical wavelength, and
the thickness dimension is defined by a vertical line passing through the first and second mirrors, and the width dimension is defined by a horizontal line that is perpendicular to the vertical line.

7. The tunable filter of claim 6 wherein
the width dimension of each cell is larger than the thickness dimension of each cell by at least ten times ($10\lambda$).

8. The tunable filter of claim 1 further comprising:
a first anti-reflective (AR) layer disposed on the first thick silicon substrate, and
a second AR layer disposed on the second thick silicon substrate,
wherein the first AR layer and the second AR layer are at opposite ends of the tunable filter.

9. The tunable filter of claim 1 further comprising:
a rigid frame of silicon surrounding the tunable filter for user handling or manufacturing purposes.

10. The tunable filter of claim 1 further comprising:
a piezoelectric actuator coupled to at least one of the first and second mirrors for selecting a separation distance between the first and second thin silicon membranes that form the variable gap.

11. The tunable filter of claim 1 wherein
the first mirror includes another thin silicon membrane, wherein the other thin silicon membrane is fixed to the first thin silicon membrane by other supports,
the second mirror includes yet another thin silicon membrane, wherein the yet other thin silicon membrane is fixed to the second thin silicon membrane by yet other supports, and
the variable gap is provided between the other thin silicon membranes.

12. A terahertz (THz) imaging device comprising:
a tunable filter for receiving optical wavelengths of light and selectively transmitting at least one optical wavelength of light, and
a focal plane array (FPA) for receiving the at least one optical wavelength of light selectively transmitted from the tunable filter,
wherein the tunable filter includes:
a first mirror comprised of a first thick silicon substrate and a first thin silicon membrane, wherein the first thin silicon membrane is fixed to the first thick silicon substrate by first patterned supports, and
a second mirror comprised of a second thick silicon substrate and a second thin silicon membrane, wherein the second thin silicon membrane is fixed to the second thick silicon substrate by second patterned supports,
wherein the first thin silicon membrane is oriented facing the second thin silicon membrane, and
a variable gap is provided between the first and second thin silicon membranes.

13. The imaging device of claim 12 wherein
the first patterned supports are configured to provide a first fixed gap between the first thin silicon membrane and first thick silicon substrate, and
the second patterned supports are configured to provide a second fixed gap between the second thin silicon membrane and second thick silicon substrate.

14. The imaging device of claim 12 wherein
the first and second patterned supports are arranged to form a plurality of cells, in which each cell is configured in a grid formation, and
the grid formation is arranged in one of an hexagonal grid, a triangular grid, a rhombus grid, a rectangular grid, and a square grid.

15. A method of making a terahertz (THz) tunable filter comprising the steps of:
coating a photoresist layer on a first silicon wafer;
etching the first silicon wafer and stripping the photoresist layer to form a pattern of protruding support cells on a silicon substrate;
attaching a second silicon wafer to the protruding support cells on the silicon substrate; and
etching the second silicon wafer to form a membrane spaced by a fixed gap from the silicon substrate;
wherein the membrane, the silicon substrate, and the fixed gap therebetween form one mirror of a Fabry-Perot (FP) tunable filter.

16. The method of claim 15 further comprising:
forming another mirror of the FP tunable filter using the steps of claim 15; and
separating, by a variable gap, the one mirror formed in the steps of claim 15 from the other mirror;

wherein the variable gap is disposed between the membranes of the respective mirrors as each faces the other.

17. The method of claim 15 wherein etching the first silicon wafer and stripping the photoresist layer to form the pattern of protruding support cells on the silicon substrate includes the step of:
arranging the pattern of protruding support cells in a grid formation;
wherein the grid formation includes hexagonal gridded cells, triangular gridded cells, rhombus gridded cells, rectangular gridded cells, or square gridded cells.

18. The method of claim 15 further including the step of:
disposing an anti-reflective (AR) layer on the silicon substrate;
wherein the AR layer is disposed at an end of the silicon substrate free-of the protruding support cells.

19. The method of claim 15 further including the step of:
forming a rigid frame of silicon around the at least one mirror of the FP tunable filter.

20. The method of claim 15 further including the step of:
coupling a piezoelectric actuator to the at least one mirror of the FP tunable filter for controlling movements of the at least one mirror.

21. The method of claim 15 wherein the second silicon wafer is a silicon-on-insulator (SOI) wafer that includes a thick sacrificial handle, a buried oxide layer and a thin silicon layer.

22. The method of claim 21 wherein the step of etching the second silicon wafer to form a membrane includes the step of:
removing the buried oxide layer to expose the thin silicon layer.

23. A terahertz (THz) tunable filter having an optical aperture for selectively transmitting light, comprising:
a first mirror comprised of a first thick silicon substrate and a first thin silicon layer, wherein the first thin silicon layer is held in place by a first supporting structure within the optical aperture, and
a second mirror comprised of a second thick silicon substrate and a second thin silicon layer, wherein the second thin silicon layer is held in place by a second supporting structure within the optical aperture,
wherein the first thin silicon layer is oriented facing the second thin silicon layer, and
a variable gap is provided between the first and second mirrors.

24. The tunable filter of claim 23 wherein
the first supporting structure includes a first series of patterned supports and the second supporting structure includes a second series of patterned supports.

25. The tunable filter of claim 24 wherein
the first and second series of patterned supports are made of silicon.

26. The tunable filter of claim 23 wherein
the first and second supporting structures each includes a thin organic layer.

27. The tunable filter of claim 23 wherein
the first mirror includes another thin silicon layer, in which the other thin silicon layer is fixed to the first thin silicon layer by another supporting structure, and
the second mirror includes yet another thin silicon layer, in which the yet other thin silicon layer is fixed to the second thin silicon layer by yet another supporting structure, and
a variable gap is provided between the first and second mirrors.

* * * * *